United States Patent [19]

Ikushima et al.

[11] 4,234,859
[45] Nov. 18, 1980

[54] ELASTIC SURFACE WAVE DEVICE AND METHOD FOR MAKING THE SAME

[75] Inventors: Hiroshi Ikushima, Hirakata; Toyota Noguchi, Kyoto; Tsuneo Danno, Moriguchi; Tooru Tamura, Ikeda, all of Japan

[73] Assignee: Matsushita Electric Industrial Co., Ltd., Japan

[21] Appl. No.: 12,193

[22] Filed: Feb. 14, 1979

[30] Foreign Application Priority Data

Feb. 14, 1978 [JP] Japan .................................. 53-16176

[51] Int. Cl.$^3$ ........................ H03H 9/25; H03H 9/42; H03H 3/08; H03H 9/10
[52] U.S. Cl. .................................. 333/151; 29/25.35; 310/313 B; 333/194
[58] Field of Search ................................ 333/150-155, 333/193-196; 310/313, 340, 326, 327; 29/25.35

[56] References Cited

U.S. PATENT DOCUMENTS

| | | | |
|---|---|---|---|
| 4,028,646 | 6/1977 | Ikushima et al. | 333/194 X |
| 4,047,130 | 9/1977 | Lim et al. | 333/194 |
| 4,054,808 | 10/1977 | Tanaka | 310/326 X |

Primary Examiner—Marvin L. Nussbaum
Attorney, Agent, or Firm—Wenderoth, Lind & Ponack

[57] ABSTRACT

This invention provides an elastic surface wave device utilizing Bluestein-Gulyaev wave and constructed by a unitary body of a piezoelectric plate having a plurality of transducers thereon, wherein the wave propagation surface being coated with an insulating rubber and being embedded in molding by an insulating powdered epoxy resin, or whose body is attached on a unitary supporting substrate via double adhesive layers; wherein one layer is composed of one kind of adhesive resin and the other is composed of another kind of adhesive resin different from the former in ultrasonic property. This device is advantageous because it has a low spurious signal level without increasing insertion loss, and is easy to manufacture and inexpensive. This invention also provides an effective method for making the device.

2 Claims, 5 Drawing Figures

ELASTIC SURFACE WAVE DEVICE AND METHOD FOR MAKING THE SAME

This invention relates to an elastic surface wave device and a method for making the same.

A known elastic surface wave element comprises a piezoelectric plate having a transmitting interdigital transducer and a receiving interdigital transducer attached on a major surface thereof. Each of the transducers comprises a pair of electrodes (usually comb-shaped) facing each other. An electric signal applied to the transmitting transducer is converted thereat to an elastic surface wave (acoustic wave) and is transferred to the receiving transducer along a wave propagation surface of the piezoelectric plate, the propagation surface being known to be defined by the transmitting and receiving transducers. As some examples of such elastic surface wave, a Rayleigh wave or pseudo Rayleigh wave (both of which will simply be called an R wave hereinafter) and a Bleustein-Gulyaev wave (which will simply be called a B.G. wave) are known. Two pairs of electrical leads are used for applying an electric signal to the transmitting transducer and picking up an electrical signal from the receiving transducer, one pair of electrical leads being respectively connected to the pair of electrodes of the receiving transducer.

Generally, an acoustic wave absorber is provided on peripheral portions of the piezoelectric plate, which portions do not include the propagation surface, for suppressing undesired spurious signals. The B.G. wave more heavily generates the elastic bulk wave (which will simply be called an EBW hereinafter) as a spurious signal than the R wave does. This is because the former is more bulky as an acoustic wave than the latter. For actual use, the elastic surface wave (which will simply be called ESW hereinafter) element is usually required to be packed in a package in the same manner as other general electronic components or devices. The ESW element thus packed is called an ESW device. In the devices utilizing a B.G. wave, more attention should be paid to the manufacturing process for the suppression of the EBW. These are the starting points of this invention.

Conventionally, it has been believed that no mechanical load such as adhesive materials should be mounted on the wave propagation surface of the piezoelectric plate. Thus, a conventional ESW device is composed of a casing having a chamber therein in which an ESW element comprising a piezoelectric plate having a pair of transducers attached therein and two pairs of electrical leads is embedded in a manner so as to leave an air gap over the wave propagation surface to make it a free surface. Therefore, such a conventional ESW device is troublesome to manufacture and is likely to be expensive. As conventional supression method of the EBW in an ESW device, the grooving on the rear surface of the piezoelectric plate on which a plurality of electrodes are attached, and the making said surface rough is known. These methods, however, are very troublesome to manufacture and fail to eliminate the EBW as an unwanted signal.

Furthermore, it is known that the ESW device shown in U.S. Pat. No. 4,028,646 has a relatively low spurious signal level, and is relatively easy to manufacture and is relatively inexpensive. However, this conventional device is not yet adequate as to these factors.

Accordingly, it is an object of this invention to provide an ESW device which has a very low spurious signal level and is very easy to manufacture and is very inexpensive.

This object is achieved in one way according to this invention by providing an ESW device comprising a resin casing having embedded therein a unitary body comprising: a piezoelectric plate; a transmitting interdigital transducer and a receiving interdigital transducer attached on one major surface of the piezoelectric plate, each transducer comprising a pair of electrodes facing each other, a wave propagation surface for an ESW being thereby defined on the major surface of the piezoelectric plate between the transducers; an insulating rubber body mounted on the wave propagation surface and in contact with both of the transducers for preventing the ESW from being transferred from the wave propagation surface to the resin casing; and two pairs of electrical leads, one pair of which are respectively connected to the pair of electrodes of the transmitting transducer and the other pair of which are respectively connected to the pair of electrodes of the receiving transducer, all of the electrical leads being out of contact with the wave propagation surface. This object is achieved in another way according to this invention by providing an ESW device comprising the above-mentioned piezoelectric plate attached on a unitary supporting substrate via double adhesive layers; wherein one layer is composed of one kind of adhesive resin and the other is composed of another kind of resin different from the former in ultrasonic property.

It is another object of this invention to provide a method of making such an ESW device.

This object is achieved in one way according to this invention by providing one method comprising forming a unitary body by: attaching a transmitting interdigital transducer and a receiving interdigital transducer on one major surface of a piezoelectric plate, each transducer comprising a pair of electrodes facing each other, a wave propagation surface for an ESW being thereby defined on the major surface of the piezoelectric plate between the transducers; mounting an insulating rubber body on the wave propagation surface, which rubber body is in contact with both of the transducers, for covering the wave propagation surface; and attaching two pairs of electrical leads to the transducers in a manner such that one pair of the electrical leads are respectively connected to the pair of electrodes of the transmitting transducer and the other pair of electrodes are respectively connected to the pair of electrodes of the receiving transducer, and all of the electrical leads are positioned out of contact with the wave propagation surface, the method further comprising covering the unitary body with a molten resin and hardening the molten resin as a casing for the unitary body. This object is achieved in another way according to this invention by providing another method comprising a unitary body by: attaching a transmitting interdigital transducer and a receiving interdigital transducer on one major surface of a piezoelectric plate, each transducer comprising a pair of electrodes facing each other, a wave propagation surface for an ESW being thereby defined on the major surface of the piezoelectric plate between the transducers; attaching on a unitary supporting substrate via double adhesive layers; wherein one layer is composed of one kind of adhesive resin and the other is composed of another kind of adhesive resin different from the former in ultrasonic property.

According to this invention, the ESW device is operable with a B.G. wave. It is because it has been discovered by the present inventors that the B.G. wave hardly decay when it has a mechanical load on the wave propagation surface in a piezoelectric plate. The piezoelectric plate can have a dielectric plate attached thereto at a surface of the piezoelectric plate opposite to the major surface of the piezoelectric plate.

Other objects, features and advantages of this invention will become apparent from the following description taken together with the accompanying drawings, in which:

FIG. 1(b) is a cross-sectional view of the ESW device of FIG. 1(a) seen from a direction perpendicular to that from which FIG. 1(a) is seen;

FIG. 2(b) is a cross-sectional view of the ESW device of FIG. 2(a) seen from direction perpendicular to that from which FIG. 2(a) is seen.

Figure 1A:
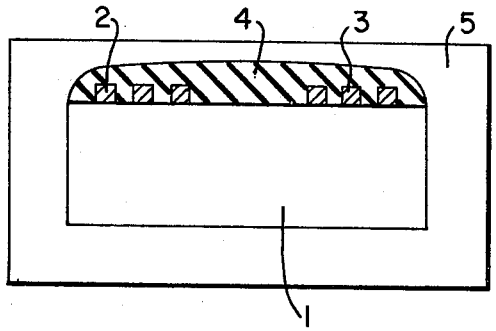
FIG. 1(a) is a cross-sectional view of the main portion of an example of an ESW device according to this invention.
Figure 1B:
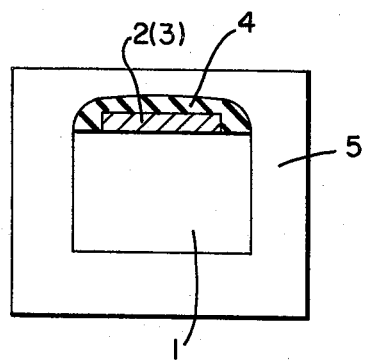

FIG. 1(a) shows a cross-sectional view of an example of an ESW device according to this invention seen from a direction parallel to the length of electrode branches of a transmitting interdigital transducer 2 and a receiving interdigital transducer 3. (In each of FIGS. 2(a), 3 and 4 also, the direction from which the device is seen is similar to that in the case of FIG. 1(a).) Referring to FIG. 1(a) and FIG. 1(b), the transducers 2 and 3 are attached on one major surface of a piezoelectric plate 1. Each transducer comprises a pair of electrodes facing each other. Each electrode comprises electrode branches, and each of reference numerals 2 and 3 shows cross-sections of the electrode branches of one electrode in each transducer. When an electrical signal is applied to the transmitting transducer 2 (between the pair of electrodes thereof), the electrical signal is converted to an acoustic or elastic wave at the surface of the piezoelectric plate at the transmitting transducer, the thus produced ESW propagating to the receiving transducer. The surface of the piezoelectric plate on which the ESW propagates from the transmitting transducer to the receiving transducer is a wave propagation surface. An insulating rubber 4 body is mounted over the wave propagation surface of the piezoelectric plate, so that the insulating rubber is in contact with both of the transducers, and extends so as to cover the wave propagation surface of the piezoelectric plate 1. The unitary body of the elements 1, 2, 3 and 4 is embedded in a resin casing 5 (package) as shown.

As piezoelectric plate (single crystal, ceramic film) can be used for the piezoelectric plate 1, known transducers can be used for the transducers 2 and 3. Known methods for embedding a body in a resin can be used for embedding the unitary body in the resin casing 5 (i.e. covering the unitary body with the resin casing 5). For example, the unitary body can be embedded by covering the unitary body with a molten resin (e.g. heated heat-hardenable resin) and a hardening the molten resin (e.g. cooling it). When a piezoelectric film is used for the piezoelectric plate 1, usually a supporting base can be used for supporting the piezoelectric film, and in this case, the transducers can be sandwiched between the supporting base and the piezoelectric film, to form a so-called sandwich structure. In this case, the insulating rubber may be mounted on the rear side (usually the electrically grounded side) of the transducers 2 and 3, which arrangement can be applied to any similar examples of ESW devices of this invention described later which use a piezoelectric film for the piezoelectric plate.

The function of the insulating rubber 4 is to prevent the produced ESW from being transferred from the wave propagation surface of the piezoelectric plate 1 to the resin casing 5, and the insulating rubber 4 suppresses spurious signals (ripples in a pass band in filter characteristics and spurious signals due presumably to an EBW) in the signals picked up by the receiving transducer without increasing the insertion loss of the input signals applied to the transmitting transducer. If the unitary body is directly immersed in a molten resin without using the insulating rubber and the resin is cooled so that it is in direct contact with the wave propagation surface of the piezoelectric plate, the insertion loss of the input signals becomes undesirably large. For this function of the insulating rubber 4, it is preferable that the insulating rubber 4 be a non-adherent material, which does not adhere to but yet tightly contacts to the wave propagation surface. Preferable materials for the insulating rubber 4 are viscous liquid in air of 1 atm. at room temperature for practical use and heat-hardenable or humidity-hardenable rubbers such as a silicone rubber. There is no critical thickness limitation for the insulating rubber layer. Of course, two small thickness thereof are not desirable. Since the displacement amplitude of the ESW on the surface of the piezoelectric plate in the thickness direction of the piezoelectric plate is usually less than 10 microns, and the thickness of the insulating rubber 4 should preferably be not less than the displacement amplitude, the thickness of the insulating rubber layer is preferably larger than about 10 microns. When the insulating rubber layer 4 is required to be exposed to a high temperature e.g. due to the temperature of the molten resin in forming the casing 5, the insulating rubber is required to be able to withstand such high temperature.

The use of the insulating rubber is more advantageous as compared with the prior art shown in U.S. Pat. No. 4,028,646, because it makes it possible to embed the unitary body of the ESW element in a resin casing in which substantially no air space is required, so that it is relatively easy to manufacture the ESW device, and the device can be relatively inexpensive. The reason why this invention is advantageous over the prior art shown in U.S. Pat. No. 4,028,646 is because in casing the ESW element, the former only requires application of a bit of viscous liquid of insulating rubber to the surface, whereas the latter requires preliminary preparation of a thin film cut in an appropriate size and mounting the film on the ESW propagation surface of the ESW element. Moreover, the ESW device thus made according to this invention can suppress the spurious signal to a greater degree without increasing the insertion loss than the device according to U.S. Pat. No. 4,028,646.

Figure 2A:
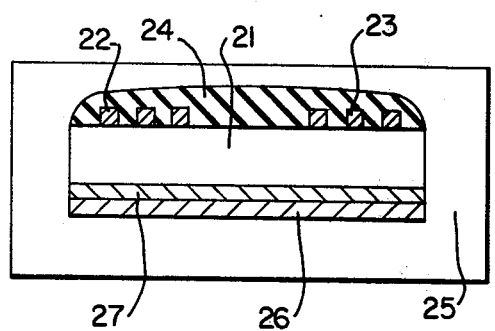
FIG. 2(a) is a cross-sectional view of the main portion of another example of an ESW device according to this invention.
Figure 2B:
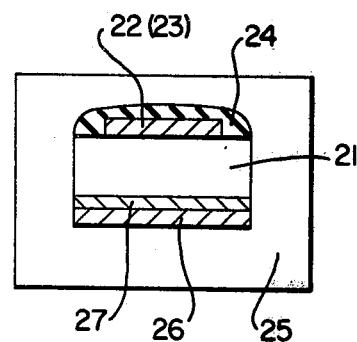

FIGS. 2(a) and 2(b) show another example of an ESW device of this invention. Elements 21 to 25 shown therein are equivalent to the elements 1 to 5, respectively, shown in FIGS. 1(a) to 1(b). The only difference between them is that a dielectric plate 26 having a dielectric constant substantially lower than that of the piezoelectric plate 21 is attached to the piezoelectric plate 21 in FIGS. 2(a) and 2(b) at a surface of the piezoelectric plate opposite to the major surface of the piezoelectric plate having the transducers 22 and 23 attached thereon, by using an adhesive material layer 27. The above-mentioned dielectric plate can have a metallic thin film (not shown in FIG. 2(a) or 2(b)) on the surface facing the piezoelectric plate 21.

The function of the dielectric plate 26 is to further decrease unwanted signals in the desired signals. It is not necessary that the dielectric plate 26 function to transmit and receive an ESW thereon. The thickness of the adhesive material layer 27 is not critical. Further, when a thin piezoelectric film is used for the piezoelectric plate 21, a supporting base such as a glass, quartz and $SiO_2$—Si is used for supporting the thin piezoelectric film, and thus in such case, the adhesive layer 27 is sandwiched between the dielectric plate 26 and the supporting base.

Figure 3:
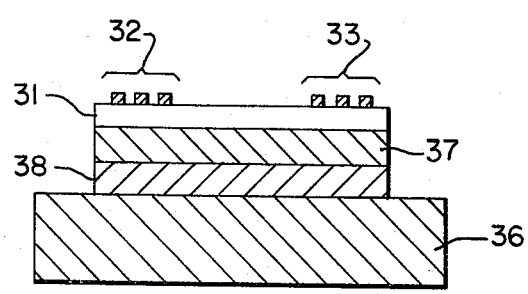
FIG. 3 is a cross-sectional view of the main portion of still another example of the ESW device according to this invention.

FIG. 3 depicts another example of an ESW device according to this invention. The elements 31 to 33 are equivalent to the elements 1 to 3, respectively, shown in FIGS. 1(a) and 1(b). An adhesive layer 37, which is attached to the piezoelectric plate 31, at a surface of the piezoelectric plate opposite to the major surface of the piezoelectric plate having the transducers 32 and 33 attached thereon. An adhesive layer 37 is composed of one kind of adhesive resin. The element 36 is equivalent to the element 26 in FIGS. 2(a) and 2(b). Another adhesive layer 38 is composed of another kind of adhesive resin different from the material of the layer 37 in ultrasonic property. The adhesive layer 38 is sandwiched between the dielectric plate 36 and another adhesive layer 37. The concrete differences between the above two adhesive layers are as follows; they are different in acoustic impedance and/or in elastic stiffness from each other and further different in the decay constant of EBW as an ultrasonic wave from each other. Generally, it is difficult to define the above differences quantitatively, because the ultrasonic properties of the polymer materials used as the base materials of the above adhesive layers is very complicated and have many unknown factors. Therefore, the double adhesive layers are not defined quantitatively as to material properties but only schematically as a complex layer structure. Of course, to use the double adhesive layer structure comprising two layers of two kinds of adhesive resins as a single layer respectively is advantageous because it makes it possible the suppression of the spurious signals without increasing the insertion loss.

The following Examples more specifically explain the features of this invention, but are not to be construed as limiting the scope of this invention.

EXAMPLE 1

Elastic surface wave devices according to this invention (represented by (B1) in Table 1) which is schematically shown in FIGS. 1(a) and 1(b) were prepared. Several structural features of each of the thus made ESW devices are shown in Table 1. A silicone rubber which is (moisture absorbent) humidity-hardenable, was used as the insulating rubber 4 in a thickness of 1 mm. For forming the resin casing 5, the unitary body made up of the piezoelectric plate 1, transducers 2 and 3, and the insulating rubber 4 was preliminarily heated and immersed in an epoxy resin powder, and the unitary body was heated at about 150° C. For comparison, ESW devices (represented by (A1) in Table 1) were prepared which are the same as those (B1) prepared above, except that they do not have an insulating rubber but have a cellophane film of about 30 microns thick as taught in U.S. Pat. No. 4,028,646.

A known piezoelectric ceramic (which is a kind of ferroelectric ceramic of lead oxide solid solution system) was used for the piezoelectric plate 1 in each case wherein the plate was polarized in the width direction so as to allow B.G. waves to propagate on the plate to be transmitted and received by normal type of interdigital transducers 2 and 3.

The filter characteristics of these devices were examined. In the case of the devices (A1), ripples, as undesired spurious signals, of 0.8 of 1.0 dB were observed in a pass band, the center frequency of which represents the peak of a desired signal. Also an undesired pass band spectra presumably caused by bulk waves depending on the electrode pitch (distance between the electrodes of each of the transducers) was observed at a higher frequency region in the same pass band. On the other hand, in the case of the devices (B1) according to this invention, ripples observed, as undesired spurious signals, were less than 0.8 dB in the same pass band for the devices (B1), very little undesired pass band spectra presumably caused by the bulk waves was observed in the same pass band. The increment of insertion loss in the case of the device according to this invention was not observed in the same pass band. Details of the observed characteristics are shown in Table 1.

TABLE 1

| Filter Characteristics of Elastic Surface Wave Devices | | | | | | |
|---|---|---|---|---|---|---|
| Thickness of the piezoelectric substrate (microns) | Electrode pitch: half of wave length (λ) (microns) | Sample No. | Central frequency ($f_c$) (MHz) | Level of unwanted signals (dB) | Relative increment of insertion loss[3] | Load resistance in circuit (Ω) |
| 500 | 300 | (A1) | 3.58[1] | 0.8–1.0 | 0.5–1.0 | 50 |
| 500 | 300 | (B1) | 3.58[1] | 0.5–0.8 | 0.5–1.0 | 50 |
| 110 | 125 | (A1) | 10.7[2] | 0.8–1.0 | 1.0–2.0 | 380 |
| 110 | 125 | (B1) | 10.7[2] | 0.1–0.2 | 1.0–2.0 | 380 |

(A1): An ESW device according to U.S. Pat. No. 4,028,046
(B1): An ESW device according to this invention
[1]: A signal burst with $f_c$ as a carrier was used as an input signal.
[2]: A continuous wave signal was used as an input signal.
[3]: Voltage loss under the listed load resistance

EXAMPLE 2

ESW devices according to this invention represented by (B) in Table 2 and schematically shown in FIGS. 2(a) and 2(b) were prepared as follows. As the piezoelectric plate 21, a piezoelectric material the same as that used in Example 1 was used. A pulp epoxy resin plate usually used as a base for a printed circuit board was used as the dielectric plate 26. An adhesive material mainly composed of an epoxy resin was used for the adhesive material layer 27. The silicone rubber 24 and the resin casing 25 were applied in the same manner as that for the insulating rubber 4 and the resin casing 5 in Example 1. The filter characteristics of these devices were examined in the same manner as in Example 1. The ripples observed, as unwanted spurious signals, in the case of the device according to this invention (FIG. 2) were not more than 0.8 db, and no undesired signal presumably caused by bulk waves was observed. In the case of the device prepared above for comparison, undesired signals similar to those observed for the device (A1) in Example 1 were observed.

were prepared, which are the same as those (C3) prepared above, except that they do not have a double adhesive layer but have a single adhesive layer between the piezoelectric plate 31 and the dielectric plate 36.

The filter characteristics of each of these devices were measured in a manner similar to that in Examples 1 and 2 by connecting an electrical resistance as a load resistance to the device and by applying a burst signal or a continuous signal to the device. The ripples observed, as undesired spurious signals, in the case of the device (C3), were less than 0.5 dB, and no undesired signal presumably caused by bulk waves was observed. The increment of the insertion loss of the device (C3) as compared with the insertion loss of the devices (A3) and/or (B3) was less than 1 to 2 dB. The ripples ob-

TABLE 2

| Filter Characteristics of Elastic Surface Wave Devices | | | | | |
| --- | --- | --- | --- | --- | --- |
| Thickness of the piezoelectric substrate (microns) | Electrode pitch: half of wave length (λ) (microns) | Sample No. | Central frequency (f$_c$) (MHz) | Level of unwanted signals (dB) | Relative increment of insertion loss[3] | Load resistance in circuit (Ω) |
| 500 | 300 | (A2) | 3.58[1] | 0.5–0.8 | 0.5–1.0 | 50 |
| 500 | 300 | (B2) | 3.58[1] | 0.2–0.5 | 0.5–1.0 | 50 |
| 110 | 125 | (A2) | 10.7[2] | 0.1–0.3 | 1.0–2.0 | 380 |
| 110 | 125 | (B2) | 10.7[2] | 0.05–0.2 | 1.0–2.0 | 380 |

(A2): An ESW device according to U.S. Pat. No. 4,028,646
(B2): An ESW device according to this invention
[1] A signal burst with f$_c$ as a carrier was used as an input signal.
[2] A continuous wave signal was used as an input signal.
[3] Voltage loss under the listed load resistance.

EXAMPLE 3

Elastic surface wave devices according to this invention represented by (C3) in Table 3 and schematically shown in FIG. 3 were prepared. As the piezoelectric plate 31, a piezoelectric material the same as that used in Examples 1 and 2 was used. The same materials as those used for dielectric plate 26, and the transducers 22, 23 were used respectively for the dielectric plate 36 and the transducers 32, 33, respectively. An adhesive material mainly composed of an epoxy resin containing a certain amount of tungsten powder, which is quick-hardenable (practically hardened in over 10 hours at room temperature) was used as the adhesive material layer 37. Another epoxy resin which is slow-hardenable (practically hardened within 10 minutes at room temperature) was used as the adhesive layer 38. For comparison, ESW devices (represented by (A3) and (B3) in Table 3)

served, as unwanted spurious signals, in the case of the devices (A3) and (B3), were up to 1.0 dB. Further, undesired pass band spectra presumably caused by EBW were slightly observed in these devices. Details of the observed characteristics are shown in Table 3. In addition, it was found that the tendency of the characteristics of all of the devices prepared here did not change even when they were embedded in the resin casing as in FIGS. 2(a) and 2(b).

TABLE 3

| Filter Characteristics of Elastic Surface Wave Devices | | | | | | |
| --- | --- | --- | --- | --- | --- | --- |
| Thickness of the piezoelectric substrate (microns) | Electrode pitch: half of wave legnth (λ) (microns) | Sample No. | Central frequency (f$_c$) (MHz) | Level of unwanted signals (dB) | Relative increment of insertion loss[3] | Load resistance in circuit (Ω) |
| 500 | 300 | (A3) | 3.58[1] | 0.8–1.0 | 0 | 50 |
| 500 | 300 | (B3) | 3.58[1] | 0.8–1.0 | 0 | 50 |
| 500 | 300 | (C3) | 3.58[1] | 0.2–0.5 | 1–2 | 50 |
| 110 | 125 | (A3) | 10.7[2] | 0.3–0.5 | 0 | 380 |
| 110 | 125 | (B3) | 10.7[2] | 0.3–0.5 | 0 | 380 |
| 110 | 125 | (C3) | 10.7[2] | 0.02–0.08 | 0.5–1.0 | 380 |

(A3): An ESW device having only a single adhesive layer between the piezoelectric plate and the dielectric plate
(B3)* An ESW device having only another single adhesive layer
(C3): an ESW device having a double adhesive layer according to this invention
[1]: A signal burst with f$_c$ as a carrier was used as an input signal.
[2] A continuous wave signal was used as an input signal.
[3]: Voltage loss under the listed resistance It can be easily understood from the foregoing that casings for ESW elements with substantially no air space therein are possible according to this invention, and the devices of this invention can be more easily manufactured than those according to U.S. Pat. No. 4,028,646. It is apparent that the use of a double adhesive layer sandwiched between the piezoelectric plate and the dielectric plate supporting it, is more effective to suppress the EBW as undesired signal as compared with the case of using the single adhesive layer partly used in U.S. Pat. No. 4,028,646. Further, it is obvious to those of ordinary skill in the art that the devices according to this invention are applicable not only to filters, but also to other functional elements such as delay lines.

What is claimed is:

1. An elastic surface wave device comprising a resin having embedded therein a unitary body comprising: a piezoelectric plate; a transmitting interdigital transducer and a receiving interdigital transducer, both transducers being attached to one major surface of the piezoelectric plate, which unitary body is attached to a unitary supporting substrate via double adhesive layers, one of which is composed of one kind of adhesive resin and the other of which is composed of another kind of resin, different from the former in ultrasonic property, each of the transducers comprising a pair of electrodes facing each other, a wave propagation surface for an elastic surface wave being thereby defined on the major surface of the piezoelectric plate between the transducers; and two pairs of electrical leads, one pair of which are respectively connected to the pair of electrodes of the transmitting transducer and the other pair of which are respectively connected to the pair of electrodes of the receiving transducer, all of said electrical leads being out of contact with the wave propagation surface.

2. A method for making an elastic surface wave device comprising the steps of forming a unitary body by:
(a) attaching a transmitting interdigital transducer and a receiving transducer to one major surface of a piezoelectric plate, each transducer comprising a pair of electrodes facing each other, a wave propagation surface for an elastic surface wave being thereby defined on the major surface of the piezoelectric plate between the transducers; and
(b) attaching said body to a unitary supporting substrate via double adhesive layers, one of which is composed of one kind of adhesive resin and the other of which is composed of another kind of adhesive resin different from the former in ultrasonic property.

* * * * *